United States Patent
Lin et al.

[11] Patent Number: 6,001,738
[45] Date of Patent: *Dec. 14, 1999

[54] METHOD OF FORMING SALICIDE

[75] Inventors: Tony Lin, Kaohsiung Hsien; Water Lur; Shih-Wei Sun, both of Taipei, all of Taiwan

[73] Assignee: United Microelectronics Corp., Taipei, Taiwan

[ * ] Notice: This patent is subject to a terminal disclaimer.

[21] Appl. No.: 09/062,115

[22] Filed: Apr. 17, 1998

[30] Foreign Application Priority Data

Jun. 23, 1997 [TW] Taiwan .................................. 86108734

[51] Int. Cl.$^6$ .................................................. H01L 21/283
[52] U.S. Cl. ........................ 438/683; 438/303; 438/586; 438/634; 438/649
[58] Field of Search .................................... 438/299, 301, 438/302, 303, 304, 305–307, 586, 592, 649, 651, 655, 682, 683, 634, 637, 664

[56] References Cited

U.S. PATENT DOCUMENTS

| | | | |
|---|---|---|---|
| 5,162,884 | 11/1992 | Liou et al. ................................ | 257/384 |
| 5,183,771 | 2/1993 | Mitsui et al. ............................ | 257/384 |
| 5,329,482 | 7/1994 | Nakajima et al. ....................... | 257/344 |
| 5,391,508 | 2/1995 | Matsuoka et al. ...................... | 257/336 |
| 5,654,212 | 8/1997 | Jang ......................................... | 438/231 |
| 5,747,373 | 5/1998 | Yu ............................................ | 438/303 |
| 5,780,348 | 7/1998 | Lin et al. ................................. | 438/303 |
| 5,869,879 | 2/1999 | Fulford, Jr. et al. .................... | 438/510 |

OTHER PUBLICATIONS

Ryssel et al. "Ion Implantion", p. 40, 1986.

*Primary Examiner*—Chandra Chaudhari
*Assistant Examiner*—Thanh Nguyen
*Attorney, Agent, or Firm*—Thomas, Kayden, Horstemeyer & Risley

[57] ABSTRACT

A method of forming salicide, of which the characteristics is the formation of a silicon nitride layer before the source/drain being implanted with dopant. The silicon nitride layer avoid the oxygen within the oxide layer to implant into the source/drain. Thus, a better salicide is obtained. In addition, the formation of the parasitic spacers made of silicon nitride at the side wall bottom of the gate spacer increases the distance between the salicide and the junction. Consequently, the leakage current is prevented. While the silicon nitride layer is removed, the polysilicon of gate and the silicon of the source/drain are amorphized. This is advantageous to the formation of salicide without the step of ion implantation.

11 Claims, 4 Drawing Sheets

METHOD OF FORMING SALICIDE

BACKGROUND OF THE INVENTION

1. Field of the Invention

The invention relates to a fabricating method of self-aligned silicide (salicide), and more particularly to a method for preventing oxygen being implanted into substrates during the implantation of forming source/drain, and to obtain salicide with a low resistance.

2. Description of the Related Art

As the integration of the metal-oxide semiconductor (MOS) devices become higher and higher, the resistance of source/drain of a MOS device gradually increases. While it becomes comparable with the resistance of the MOS channel, to reduce the sheet resistance of drain/source and to ensure the integrity of the shallow junction between metal and MOS device, salicide process has been commonly used in the fabrication under 0.5 $\mu$m.

One of the conventional salicide processes is shown as FIG. 1A to FIG. 1E. A substrate 10 on which there is at least a MOS region 11 including a gate 12, a lightly doped region 12a (LDD), and a device isolation 13, for example, a shallow trench isolation (STI), or a field oxide layer is provided. An insulation layer 14, such as a silicon oxide layer or a silicon nitride layer, is formed on the surface of the substrate 10. The insulation layer 14 is then etched back to form a spacer 15 at the side walls of the gate region 12. Meanwhile, a native oxide layer 15a is formed on the surface of the substrate 10. By using the spacer 15 and the gate 12 as masks, the substrate 10 is implanted with dopant to form a source/drain 16, as shown in FIG. 1B.

Referring to FIG. 1C, the substrate 10 is implanted by dopant such as As ions, so that a layer of amorphous silicon is formed on the surface of the silicon substrate 10. This is called the pre-amorphization effect. Then, the oxide layer 15a is removed. A metal layer 17, for example, a titanium layer, is formed on the substrate 10. Through a rapid thermal process, the metal layer 17 is reacted with the polysilicon on the surface of the gate 12 and the silicon in the surfaces of the source/drain 16 to form a salicide layer 18. The unreacted metal is then removed by wet etching. The resultant device is shown as FIG. 1D.

Referring to FIG. 1E, a dielectric layer 19 such as a silicon oxide or a silicon nitride layer is formed. The dielectric layer 19 is patterned to form a contact 20 and thus, the surfaces of source/drain 16 and part of the isolation are exposed.

The above mentioned salicide process causes a dopant effect, that is, as the dopant implanted into source/drain, the oxygen within the native oxide layer on the surface of source/drain is implanted into the source/drain with the implanted dopants. The subsequent salicide process is thus affected and the quality of the salicide is deteriorated. This effect is more serious in NMOS since the bigger As and P ions can carry more oxygen. On the contrary, the effect is not that obvious due to the smaller B ions in PMOS. Moreover, at the part of the source/drain close to the gate, leakage current is likely to happen to cause the device failure, especially at the shallow junction in the sub-micron devices.

SUMMARY OF THE INVENTION

It is therefore an object of the invention to provide a method of forming salicide. A silicon nitride layer is formed before the dopant is implanted into the source/drain. Thus, the oxygen within the oxide layer to be implanted into the source/drain is avoided.

It is another object of the invention to provide a method of forming salicide. Increasing the distance between salicide and the source/drain by the formation of a silicon nitride spacer, the leakage current is prevented.

It is the other object of the invention to provide a method of forming salicide. By the amorphization of the surface of silicon substrate during etching back, a uniform salicide can be formed without a step of dopant implantation.

The further objects, as well as the advantages and purpose of the invention, will be set forth in part in the description which follows, and in part will be obvious from the description, or may be learned by practice of the invention. The advantages and purpose of the invention will be realized and attained by the elements and combinations particularly pointed out in the appended claims.

To achieve the objects and advantages, and in accordance with the purpose of the invention, as embodied and broadly described therein, the invention is directed a method of forming salicide comprising first that a substrate doped with the first type of dopant is provided. On the substrate, there is at least a MOS device which comprises a gate, a spacer around the side wall of the gate, a lightly doped region, and an isolation. A silicon nitride layer is formed on the substrate. By using the spacer and the gate as masks, the device region is implanted by the second type dopant to form source/drain. By performing anisotropic etching, the silicon nitride layer is removed and the a parasitic spacer is formed around the side wall bottom of the gate spacer. Meanwhile, the surfaces of the gate and the source/drain are amorphized. A metal layer is formed on the substrate, and a rapid thermal process is performed. The metal layer is reacted with the surfaces the gate and source/drains to form salicide. By selective etching, the unreacted metal layer is removed.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of the specification, illustrate on embodiment of the invention and together with the description, serve to explain the principles of the invention. In the drawings, FIGS. 1A to 1E (Prior Art) shows a conventional method of forming salicide.

DESCRIPTION OF THE PREFERRED EMBODIMENT

Figure 1A:
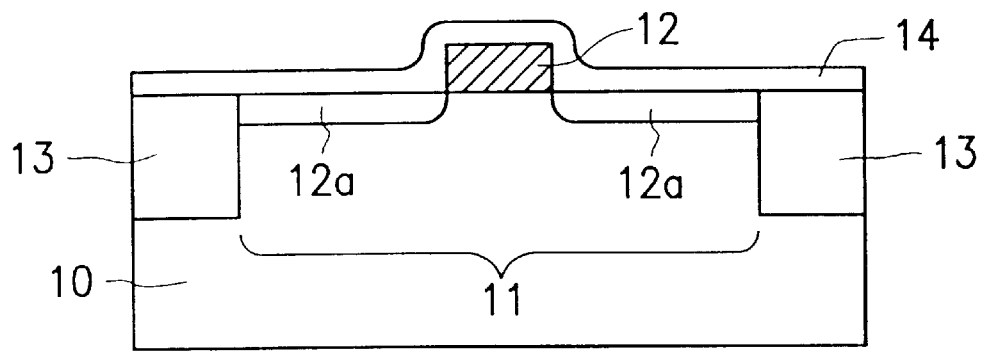
Figure 1B:
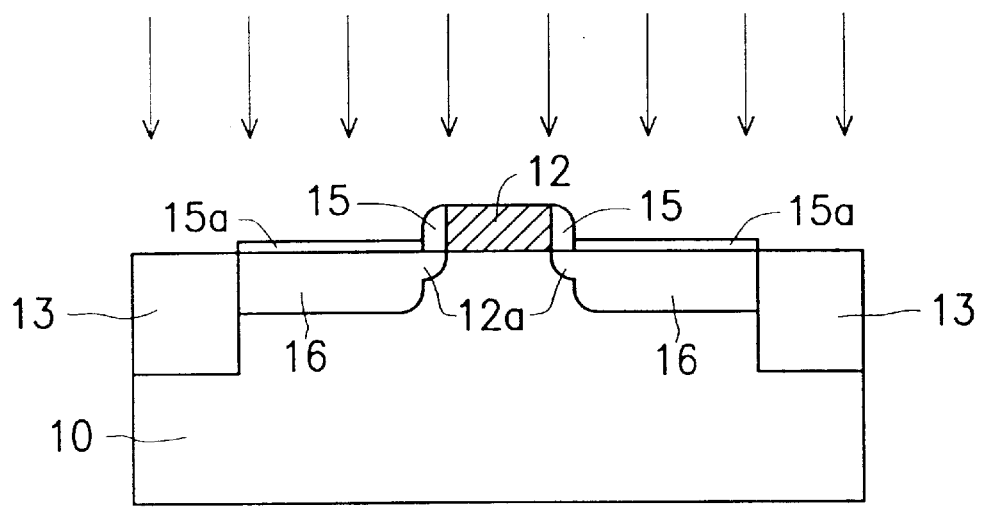
Figure 1C:
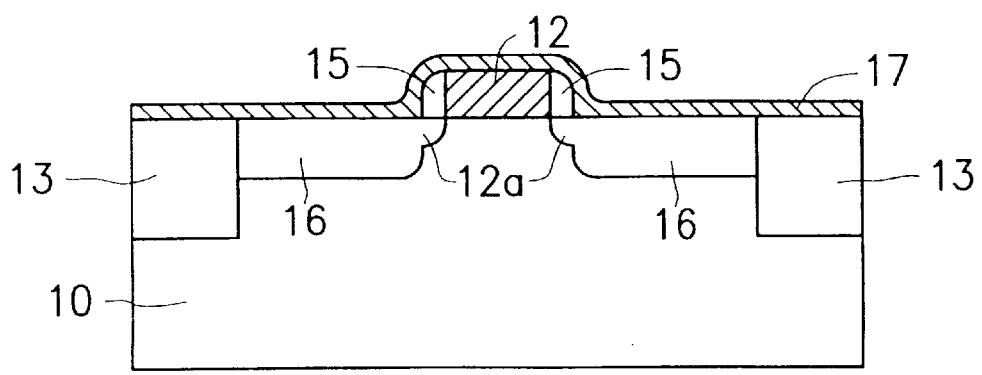
Figure 1D:
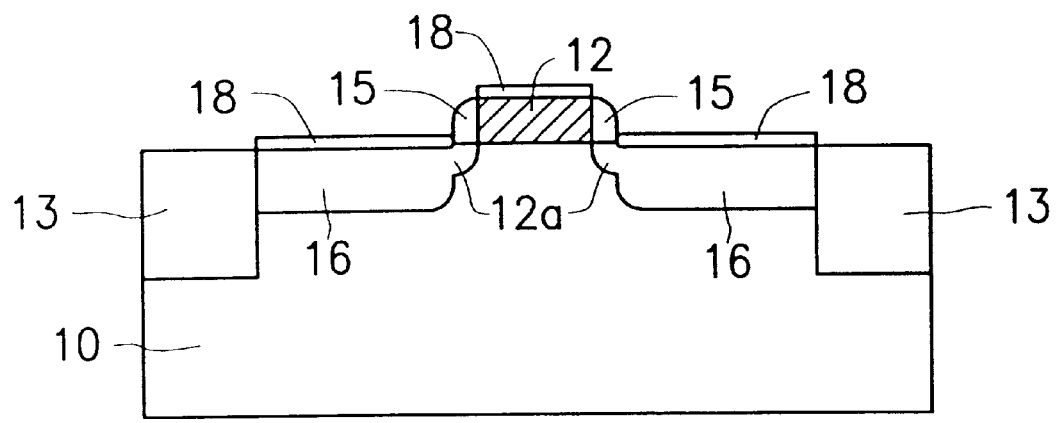
Figure 1E:
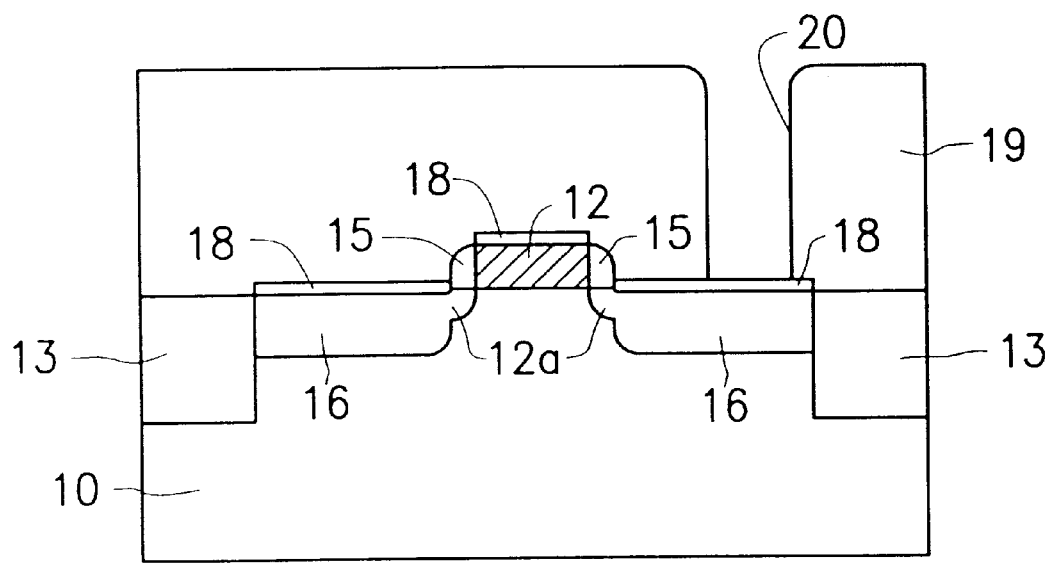
Figure 2A:
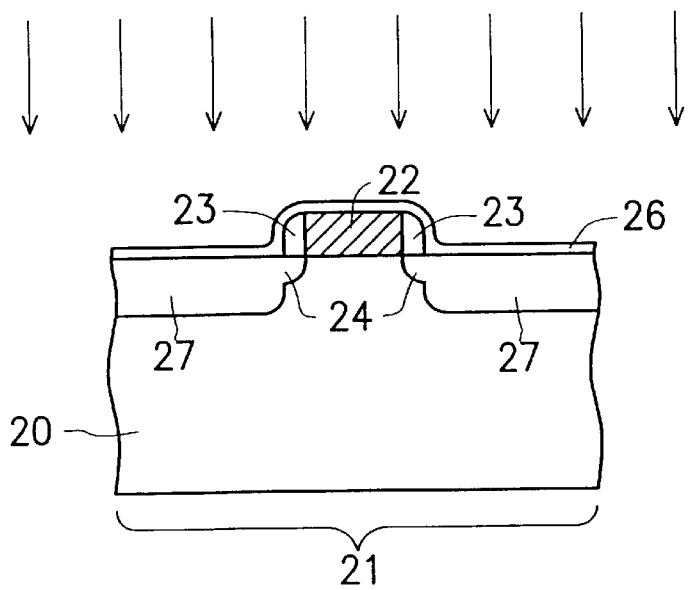
FIGS. 2A to 2E present one preferred embodiment according to the invention.

FIG. 2A to FIG. 2E shows a preferred embodiment according to the invention. A P-type silicon substrate is used as an example, however, the invention can also be applied to a N-type substrate. Referring to FIG. 2A, a P-type silicon substrate 20 is provided. On the active region of the substrate 20, there is at least a MOS device 21 which comprises a gate region 22, a spacer 23 around the side wall of the gate 22, a lightly doped region 24. The active region is surrounded and therefore defined by a device isolation region (not shown in the figure) such as a shallow trench isolation made of silicon oxide or a field oxide layer In this embodiment, a shallow trench is used for the device isolation region. A silicon nitride layer 26 is formed on the substrate 20 by chemical vapor deposition. By using the spacer 23 and the gate region 22 as masks, N-type ions are implanted into the substrate 20 to form a source/drain 27. In this embodiment, the silicon nitride layer 26 is formed before the N-type ions are heavily doped to form the source/drain region 27 with a lightly doped drain (LDD) structure. The silicon nitride layer 26 can protect the spacer 23 from heavily implantation. However, the silicon nitride layer 26 can also be formed after the source/drain region 27 is formed in the substrate 20. One of the purposes of the silicon nitride layer 26 is to form a parasitic spacer as is to be described below.

Figure 2B:
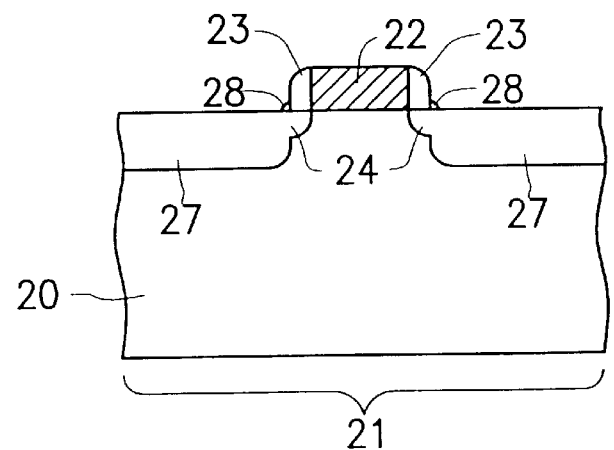

In FIG. 2B, the silicon nitride layer 26 is removed by anisotropic etching back. At the same time, a parasitic spacer 28 are formed around the of the side wall bottom of the spacer 23. Meanwhile, the configuration of silicon in the surfaces of the gate 22 and the source/drain 27 are irregularly arranged. Thus, an amorphous or amorphous-like silicon substrate is formed. The formation of the parasitic spacer increases the distance between the junction and the salicide.

Figure 2C:
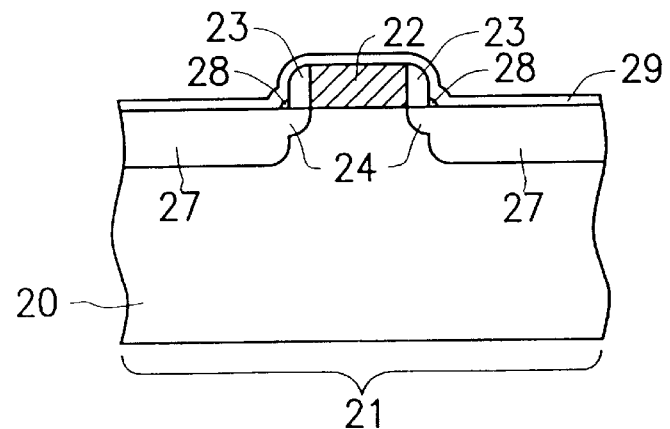
Figure 2D:
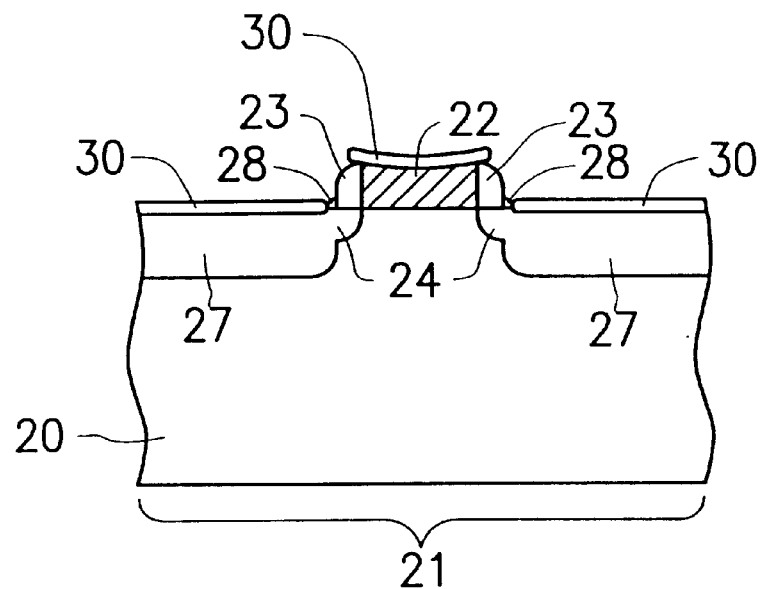

In FIG. 2C and FIG. 2D, a metal layer 29, for example, a titanium layer, is formed on the substrate 20. Through a rapid thermal process, the metal layer 29 is reacted with amorphous silicon in the surfaces of gate 22 and the source/drain 27 to form salicide 30. By using selective wet etching, the unreacted metal is removed. The resultant structure is shown as FIG. 2D.

Figure 2E:
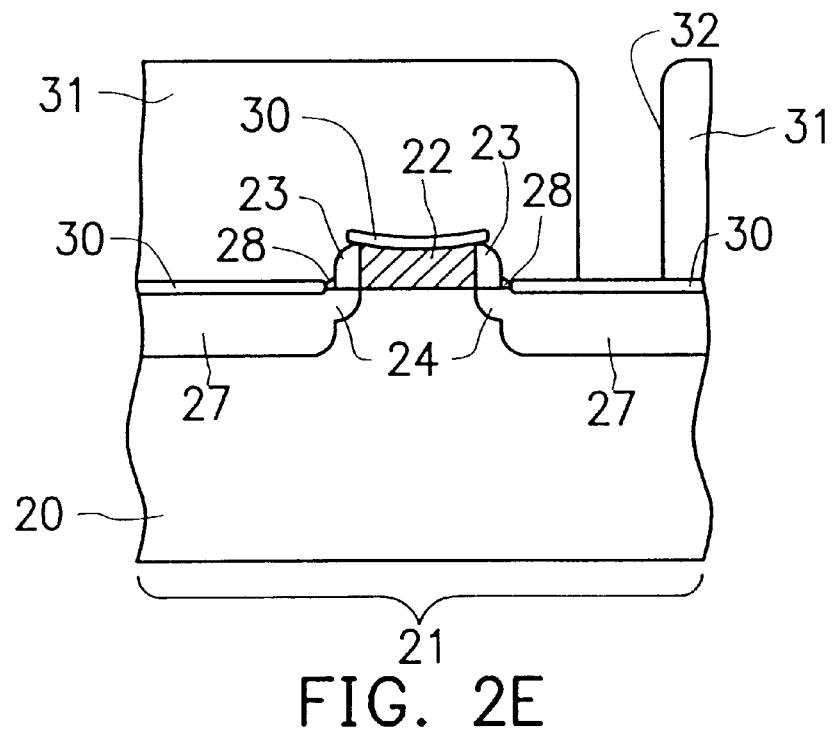

Referring to FIG. 2E, a dielectric layer 31, for example, a silicon oxide layer or a silicon nitride layer is formed on the substrate 20. The dielectric layer 31 is patterned to form a contact opening 32 and expose the salicide of the source/drain. The subsequent procedures are the same as the conventional fabrication method.

According to the invention, the advantages of the method of forming salicide described in the above preferred embodiment are as follows.

1. Before dopant implantation to form a source/drain, a silicon nitride layer is formed to avoid the oxygen within the oxide layer implanting into the source/drain.

2. In the subsequent step of removing silicon nitride layer, the formation of a parasitic spacer around the side wall bottom of the gate spacer increases the distance between the salicide and the junction. Thus, the leakage current is prevented.

3. While the silicon nitride layer is being removed, the surfaces of the gate and the source/drain are amorphized or become amorphous-like, which is advantageous to the formation of salicide. The dopant implantation step in the conventional methods are omitted.

Other embodiments of the invention will apparent to those skilled in the art from consideration of the specification and practice of the invention disclosed herein. It is intended that the specification and examples to be considered as exemplary only, with a true scope and spirit of the invention being indicated by the following claims.

What is claimed is:

1. A method of forming a self-aligned silicide (salicide), the method comprising:

providing a substrate doped with a first conductivity type of dopant, on an active region of the substrate, providing at least a metal-oxide semiconductor device which comprises a gate, a spacer around a side wall of the gate, a lightly doped region in the substrate at each side of the gate;

forming a conformal insulating layer over the substrate, wherein the insulating layer includes a material different from a material of the spacer in a property of etching rate;

implanting a second conductivity type of dopant into the device to form a source/drain region with a lightly doped drain (LDD) structure by using the spacer and the gate as masks;

removing the insulating layer by an etching back process, so that a parasitic spacer is formed at a bottom portion of the spacer of the gate, and top surfaces of the gate and the source/drain region are consequently amorphized by the etching back process; and forming a metal salicide layer on the top surfaces of the gate and the source/drain region.

2. The method according to claim 1, wherein the first conductivity type of dopant comprises a P-type dopant and the second conductivity type-of dopant comprises an N-type dopant.

3. The method according to claim 1, wherein the first conductivity type of dopant comprises an N-type dopant and the second conductivity type of dopant comprises a P-type dopant.

4. The method according to claim 1, wherein the active region is isolated by an isolation structure.

5. The method according to claim 1, wherein the active region is isolated by one selected from a group consisting of a shallow trench isolation (STI) structure and a field oxide (FOX) structure.

6. The method according to claim 1, wherein the metal salicide layer comprises a titanium salicide layer.

7. The method according to claim 1, wherein after the step of forming the salicide layer, the method further comprises:

forming a dielectric layer over the substrate; and patterning the dielectric layer to form a plurality of contact openings to expose a portion of the source/drain region.

8. The method according to claim 1, wherein the insulating layer comprises silicon nitride if the spacer comprises silicon oxide, and the insulating layer comprises silicon oxide if the spacer comprises silicon nitride.

9. The method according to claim 1, wherein the step of forming the metal salicide layer further comprises:

forming a metal layer over the substrate; and performing a rapid thermal process, so that the metal layer reacts with silicon material on the top surfaces of the gate and the source/drain region to form the salicide layer;

removing an unreacted portion of the metal layer.

10. The method according to claim 1, wherein the step of forming the silicon nitride layer is performed before the step of implanting the second conductivity type of dopant.

11. The method according to claim 1, wherein the step of forming the silicon nitride layer is performed after the step of implanting the second conductivity type of dopant.

* * * * *